United States Patent
Patti et al.

(10) Patent No.: US 6,465,857 B1
(45) Date of Patent: Oct. 15, 2002

(54) SEMICONDUCTOR PARTICLE DETECTOR AND A METHOD FOR ITS MANUFACTURE

(75) Inventors: Davide Patti, Catania (IT); Giuseppina Valvo, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 252 days.

(21) Appl. No.: 09/593,332

(22) Filed: Jun. 14, 2000

(30) Foreign Application Priority Data

Jun. 15, 1999 (EP) .............................. 99830367

(51) Int. Cl.$^7$ ..................... H01L 31/115; H01L 21/00
(52) U.S. Cl. ............................ 257/429; 438/56
(58) Field of Search ......................... 257/428, 429, 257/430; 438/56, 48

(56) References Cited

FOREIGN PATENT DOCUMENTS

| EP | 0 302 820 | 2/1989 | ............ H01L/31/10 |
|----|-----------|--------|------------------------|
| EP | 0 730 304 | 9/1996 | ............ H01L/29/00 |

OTHER PUBLICATIONS

Randazzo et al., "Integrated Front–End for a Large Strip Detector with E, ΔE and Position Measurements", IEEE Transactions on Nuclear Science, vol. 46, No. 5, Oct. 1999, pp. 1300–1309.*

Tudisco S et al: "A new large area monolithic silicon telescope" Nuclear Instruments & Methods in Physics Research, Section—A: Accelerators, Spectrometers, Detectors and Associated Equipment, NL, North–Holland Publishing Company, Amsterdam, vol. 426, No. 2–3, p. 436–445 XP004166513, ISSN: 0168–9002, *p. 437, column 1, paragraph 3—column 2, paragraph 2; figure 1*.

Patent Abstracts of Japan, vol. 012, No. 420 (E–679), Nov. 8, 1998 & JP 63 156368 A (Shimadzu Corp.), Jun. 29, 1988.

Thungström et al.: "Fabrication of an integrated ΔE–E–silicon detector by wafer bonding using cobalt disilicide", Nuclear Instruments and Methods in physics research A 391 (1997), pp. 315–328.

* cited by examiner

Primary Examiner—Michael Sherry
Assistant Examiner—Evan Pert
(74) Attorney, Agent, or Firm—Lisa K. Jorgenson; Allen, Dyer, Doppelt, Milbrath & Gilchrist, P.A.

(57) ABSTRACT

A chip of semiconductor material includes a first layer with a first type of conductivity having a surface on the first major surface of the chip, a second layer with the first type of conductivity having a surface on the second major surface of the chip, and a third layer with the first type of conductivity having a resistivity lower than those of the first and second layers and disposed between the first layer and the second layer. A first region with a second, type of conductivity, extends from the first surface into the first layer, and a second region with the second type of conductivity, extends from the second major surface into the second layer. First, second and third electrical connections are provided for connection with the first region, the second region, and the third layer, respectively. To provide a position detector which does not require a large number of connections, the second electrical connection includes two electrodes arranged a predetermined distance apart on the surface of the second region.

16 Claims, 2 Drawing Sheets

SEMICONDUCTOR PARTICLE DETECTOR AND A METHOD FOR ITS MANUFACTURE

FIELD OF THE INVENTION

The present invention relates to devices for detecting atomic or nuclear particles and, more particularly, to semiconductor particle detectors.

BACKGROUND OF THE INVENTION

During the investigation of nuclear reactions brought about in the laboratory, it is necessary to detect and to identify the products of nuclear reactions, which may be ions of atoms or nuclear fission fragments with higher or less high atomic numbers, or alpha particles. Similar requirements generally arise during analysis of radioactive phenomena with the emission of high-energy particles, as in cosmic-ray analysis.

In order to identify a particle, it is necessary to measure various quantities such as electric charge, kinetic energy, vectorial momentum, and atomic number. A known method of measuring charge and energy provides for the use of two superimposed semiconductor detectors, of which one is relatively thick (300–400$\mu$m) and one is relatively thin (from a few $\mu$m to a few tens of $\mu$m). An incident particle interacts first with the thin detector, losing only some of its energy ($\Delta E$) and then with the thick detector to which it yields all of its residual energy (E–$\Delta E$), where E represents the energy of the particle before impact with the thin detector.

The manufacture of $\Delta E$ detectors is quite difficult, particularly when detectors with a relatively extensive active area are required as is the case for position detectors, that is, detectors which can also provide information on the spatial distribution of the incident particles. In these cases, it is necessary to form plates of semiconductor material with an area of as much as a few hundred square centimeters and a thickness of only about ten $\mu$m, which would therefore be extremely fragile and difficult if not impossible to handle.

Various techniques have been proposed for the manufacture of detectors of this type. One of these (described in an article by G. Thungstrom et al., in Nuclear Instr. and Meth. in Ph. Res., A 391 (1997) 315–328) provides for joining of two superimposed silicon wafers with the use of a metal silicide as a joining and interface layer, reduction of the thickness of one of the wafers to achieve the desired thickness for the $\Delta E$ detector and passivation of the free surfaces of the wafers thus joined, opening of windows for the active areas of the detector and for the connection to the metal silicide interface layer, and implantation and diffusion of doping impurities to form junctions.

The resulting structure is shown schematically and in section in FIG. 1. It includes a first, n-type monocrystalline silicon wafer 10 with a low concentration of impurities (n--), for example, phosphorus, having a surface layer 11 with a higher concentration of n-type impurities (for example, arsenic) and by a second silicon wafer 9, which is also n-type with a low concentration of impurities (phosphorus), and which is joined to the first wafer by a layer 12 of cobalt silicide. Two planar p-type regions 13 and 14 are formed on the free surfaces of the two wafers and metal contacts 15 and 16 which form two electrodes of the detector are formed thereon. A third electrode is formed by a contact 17 on the cobalt silicide layer 12. From an electrical point of view, the structure is equivalent to a pair of diodes having a common cathode (the layer 12). The upper, thin diode forms the $\Delta E$ detector and the lower, thick diode forms the $\Delta$-E detector.

In operation, two voltages, –V1 and –V2 relative to a common terminal represented by the ground symbol in the drawing, are applied between the upper and lower electrodes 15 and 16, respectively, and the intermediate electrode 17, the voltages being of a sign such as to bias the two diodes in reverse. Two depletion regions are thus formed between the two p regions and the two n layers adjacent thereto, which form the active portions of the two detectors. A particle to be detected, represented by an arrow with a broken line, strikes the front surface of the detector and, as it passes through the two depletion regions, brings about the formation of electron-hole pairs which move towards the electrodes, giving rise to pulsed currents. These currents are collected and amplified by suitable circuits, generally indicated 18 and 19, and are then measured and displayed by a suitable electronic device, indicated 7, to give an indication of the quantities $\Delta E$ and E–$\Delta E$ and hence of the masses of the incident particles.

With the known detector described above, the portion which detects $\Delta E$ can be made very thin while avoiding the problems of fragility indicated above because it is processed when it is fixed to the much thicker portion which detects E–$\Delta E$. However, this detector is not suitable for mass production because it requires processing steps which are not provided for in normal processes for the manufacture of monolithic integrated circuits. Moreover, it cannot function as a position detector.

A structure which can be produced by standard techniques and which can be used as a position detector is described in patent publication EP-A-0730304 and is shown schematically in FIG. 2. As can be seen in the drawing, the detector is formed in a single monocrystalline silicon chip 20 which comprises three superimposed layers: two n-type layers, that is, an upper layer 22 and a lower layer 23, and one p-type layer 21 which is strongly doped and is therefore marked P+, and which is "buried", that is, interposed between the two n-type layers, and extends to a certain distance from the lateral surface of the chip. In order to contact the p+layer 21 electrically, a region 24, which is also a strongly doped p-type region is provided, extending from the upper surface of the chip to the p+ layer 21 and having, on the surface, a contact element in the form of a metal strip 27, for example, an aluminium strip. Seen in plan, the p+ contact region 24 and the metal strip 27 are typically in the form of square or rectangular frames.

The upper layer 22 and the lower layer 23 are contacted electrically by two n-type surface regions which are strongly doped and are therefore marked N+ and indicated 31 and 32, respectively, and by two metal layers 25 and 26, respectively. The latter, together with the metal strip 27, form the terminal electrodes of the detector and serve to connect the detector to biasing voltage sources and to circuit amplifiers, processors and indicators similar to those already described briefly with reference to FIG. 1.

The above-described structure is produced by the usual manufacturing processes for planar technology. This enables the detector to be mass produced, although with some difficulties and with results which are not always completely satisfactory. In particular, it is the formation of the buried layer which creates some problems. It can in fact be produced by high-energy implantation of boron ions directly at the desired depth in the substrate, or by surface doping of the substrate followed by the formation of the n layer 22 by epitaxial growth. In the first case, the high-energy implantation is a fairly critical and potentially harmful operation and, in the second case, when operating with the usual monocrystalline silicon substrates with <111> crystallographic orientation and with boron as the dopant, phenomena of epitaxial shift (epi-shift), self-doping and disappearance of the alignment marks for identifying the limits of the buried geometrical arrangements occur. This leads to an enlargement of the buried layer which is difficult to control.

The structure of FIG. 2 can be modified, as shown in FIG. 3, to operate as a position detector. The modification includes the formation of elemental cathode electrodes 31a–31d distributed over the active surface of the ΔE detector and of the connection of each elemental cathode electrode to the detection circuit by a respective metal contact 25a–25d. This considerably increases the complexity of the manufacturing process.

SUMMARY OF THE INVENTION

An object of the present invention is to provide a position detector which does not require a large number of connections.

Another object is to provide a method of manufacturing a ΔE–E detector which provides solely for standard planar technology processing steps but which is not subject to collateral defects described above with reference to the manufacture of the structure of FIG. 2.

These and other objects are achieved by a chip of semiconductor material including a first layer with a first type of conductivity having a surface on the first major surface of the chip, a second layer with the first type of conductivity having a surface on the second major surface of the chip, and a third layer with the first type of conductivity having a resistivity lower than those of the first and second layers and disposed between the first layer and the second layer. A first region with a second type of conductivity, extends from the first surface into the first layer, and a second region with the second type of conductivity, extends from the second major surface into the second layer. First, second and third electrical connections are provided for connection with the first region, the second region, and the third layer, respectively. To provide a position detector which does not require a large number of connections, the second electrical connection includes two electrodes arranged a predetermined distance apart on the surface of the second region.

BRIEF DESCRIPTION OF THE DRAWINGS

The invention will be understood further from the following detailed description of an embodiment thereof, given by way of non-limiting example, with reference to the appended drawings, in which.

DETAILED DESCRIPTION OF THE PREFERRED EMBODIMENTS

Figure 4:
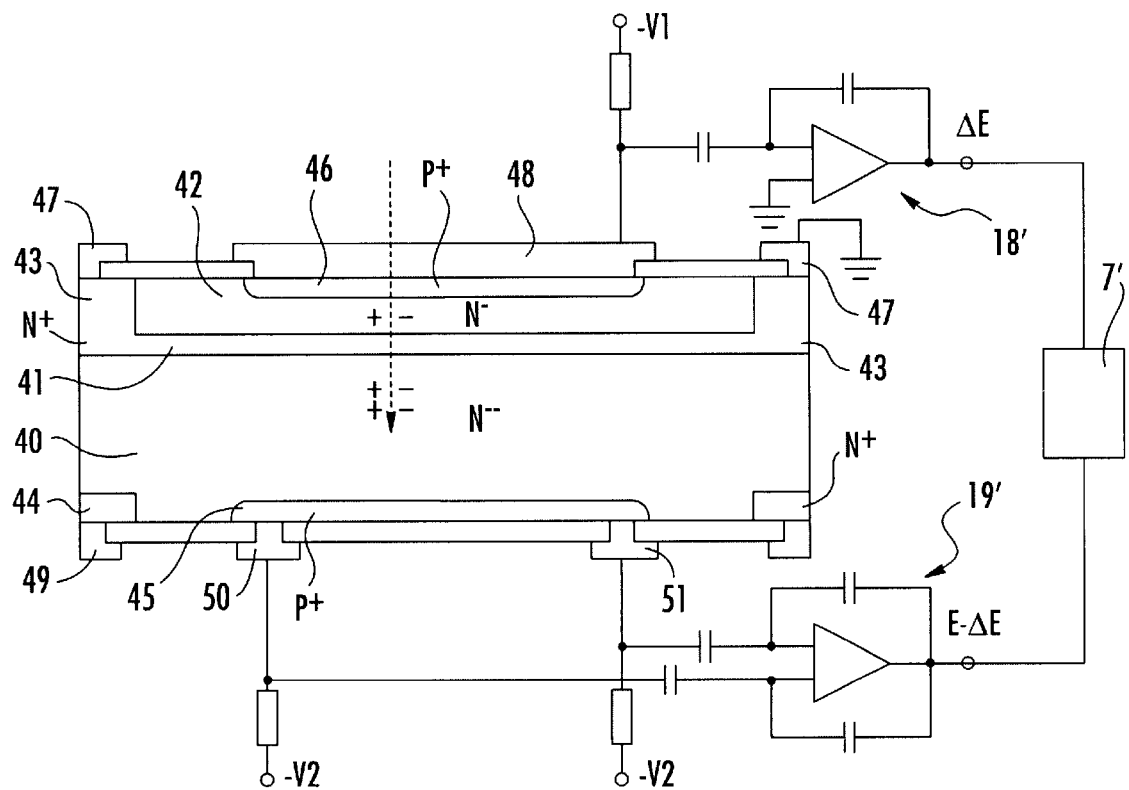
FIG. 4 shows a cross-section of a particle detector and a circuit which form a particle-detecting device according to the invention.

The structure of FIG. 4 can be formed from a monocrystalline silicon wafer having <111>or <100>crystallographic orientation, doped with n-type impurities (for example, phosphorus) at a low concentration (for example, with resistivity greater than 6000 ohm·cm). A plurality of identical structures may be formed in the wafer, or a single structure may occupy the entire wafer. The main steps of the manufacturing process will be described below.

The first step includes implantation of n-type doping impurities (for example, phosphorus ions) at a high concentration through the front surface of the wafer and subsequent heat treatment to diffuse the impurities implanted so as to produce, on a layer 40 of the starting material, a layer 41 with lower resistivity (for example 6 mohm ·cm). Then an n-type monocrystalline silicon layer 42 is formed by epitaxial growth on the surface of the wafer, that is, on the free surface-of the layer 41. The parameters of the process are selected so as to achieve a resistivity higher than that of the layer 41 but preferably lower than that of the layer 40 (for example, 100 ohm·cm) and a thickness (for example, 10 $\mu$m) such as to ensure a predetermined energy loss (ΔE) of the particles to be detected. The layer 41 is thus "buried" between the layers 40 and 42 and will also be referred to below as the intermediate layer.

The method also includes formation of an electrical connection to the intermediate layer 41 through the layer 42. This connection can be produced by the formation of deep contact regions 43 by known photolithography and diffusion techniques. Alternatively, the electrical connection to the intermediate layer 41 may be formed by first hollowing out channels (trenches) by known photolithography and etching techniques through the entire thickness of the epitaxial layer 42, by then forming diffused n+ regions on the walls of the trenches by angled ion implantation and heat treatment and, finally, by filling the trenches with doped polycrystalline silicon or with doped amorphous silicon.

A thin silicon dioxide layer is deposited on the front of the wafer to protect the front of the wafer during the subsequent processing steps on the back of the wafer. Then, the method includes formation, by the usual photolithography, implantation and diffusion techniques, of an n+ region 44, for example, phosphorus, which extends as a ring or as a frame along the edge of the structure in the layer 40 from the back surface of the wafer, with the function of a "channel stopper". A region 45 is formed by implantation and diffusion of p-type impurities (for example, boron ions). A thick layer of silicon dioxide is formed on the back of the wafer by high-temperature growth to protect the back.

The thin silicon dioxide protective layer is removed from the front of the wafer, and a region 46 is formed on the front of the wafer by implantation and diffusion of p-type impurities (for example, boron ions). The method the includes formation of metal contact electrodes by usual photolithography and "sputtering" deposition techniques, particularly an electrode 47 on the surface of the deep contact region 43 (or on the surface of the polycrystalline silicon when the connection to the buried layer 41 has been formed by the "trench" technique described briefly above), an electrode 48 on the surface of the region 46, an electrode 49 on the surface of the "channel stopper" region 44, and two electrodes 50 and 51 disposed a certain distance apart, and preferably formed by two parallel strips disposed in the vicinity of two opposite edges of the region 45.

Figure 1:
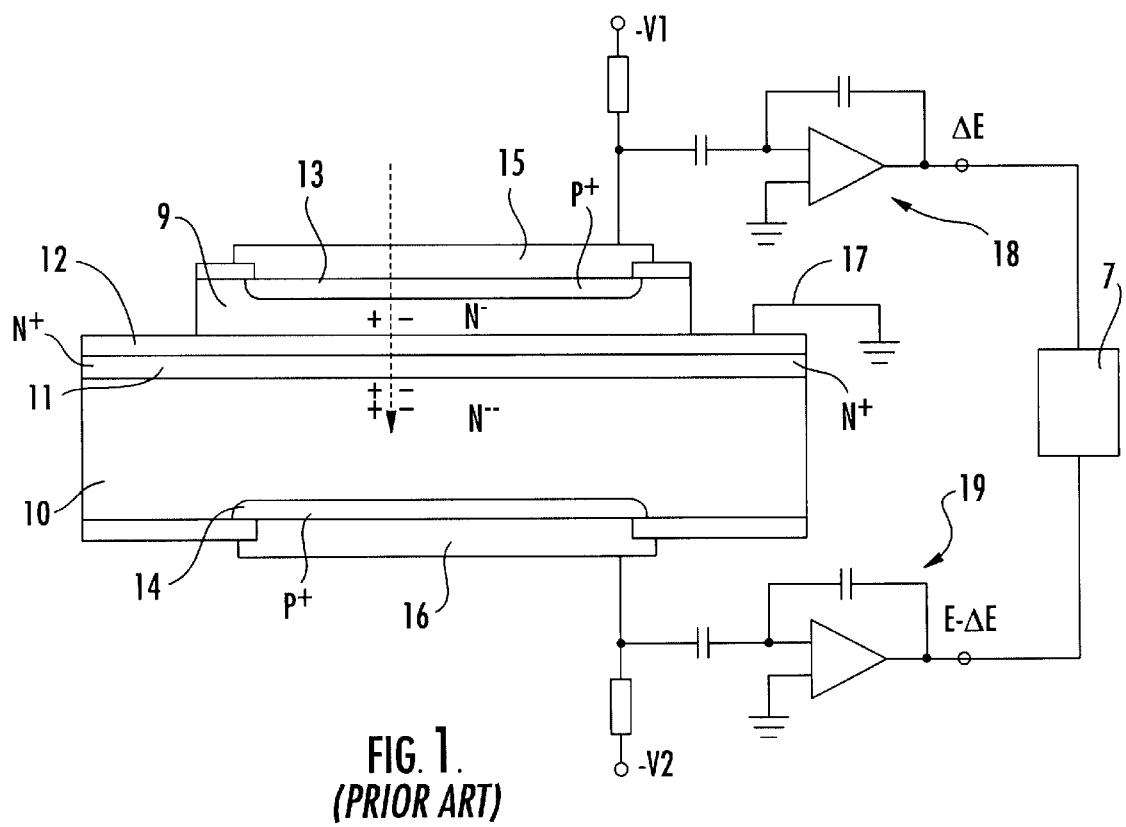
FIG. 1 shows a cross-section of a known particle detector and a circuit which form a particle-detecting device.

The structure described above is used in a circuit similar to that of FIG. 1 but with an important difference, as shown in FIG. 4. Each of the two electrodes in contact with the anode of the lower diode is connected to an input terminal of a comparator 19'. The output of the comparator 19' is applied to a circuit 7' which cannot only process the ΔE and (E −ΔE) signals but can also identify the position at which the particles strike the surface of the detector. This is possible because the currents induced in the anode of the lower diode, that is in the p+ region 45, are collected by the two electrodes 50 and 51 at two points which are spaced apart.

For example, a particle which penetrates the detector to the left of the central median line, as shown in FIG. 4 is considered. This will give rise to the formation of charges which will be collected by the anode 45 in a position closer to the electrode 50 than to the electrode 51. These charges will bring about different voltage drops between this position and each of the electrodes because of the different resistive paths. The difference between the potentials of the electrodes 50 and 51 is thus a measure of the position of impact of the particle. The distance between the two electrodes 50 and 51 and the resistivity of the anode region 45 are selected so as to achieve an optimal sensitivity of the detector.

In the embodiment described, the position measurement is limited to the direction perpendicular to the electrodes 50 and 51. However, it is also possible to produce a detector also having two electrodes opposed in the direction perpendicular thereto in order also to perform the measurement in this direction and thus to enable the point of impact of the particle to be identified with greater accuracy.

Figure 2:
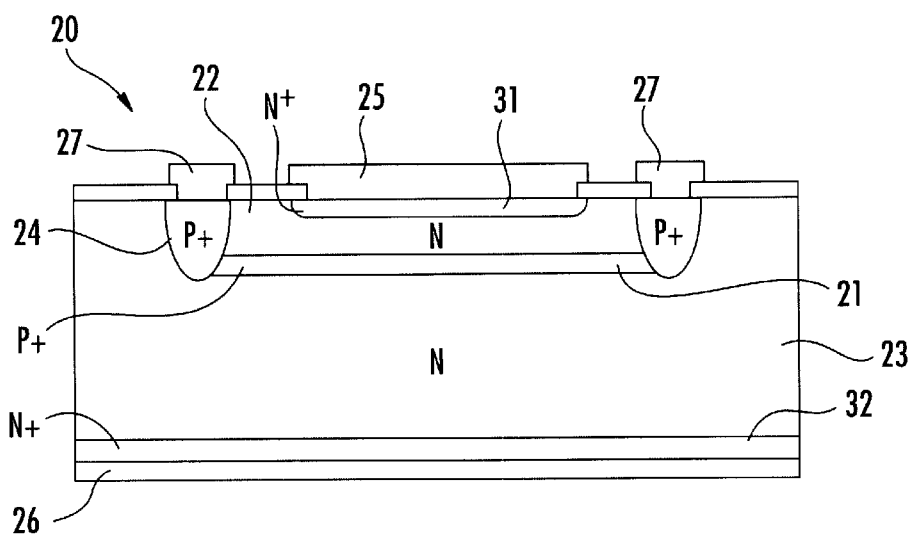
FIG. 2 shows a cross-section of another known particle detector.
Figure 3:
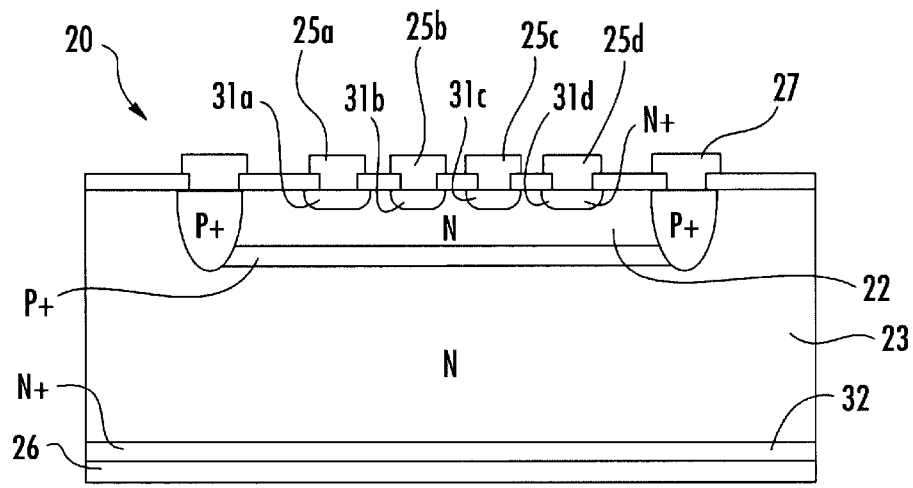
FIG. 3 shows a cross-section of a known particle detector which allows the points of incidence of the particles to be located.

It is clear from the foregoing description that the structure according to the invention can measure not only the $\Delta E$ and E parameters but also the position of impact of the particles on the detector. The structure can be produced with the use of techniques usual in the mass production of semiconductor devices but without the disadvantages of the known structures of the type shown in FIG. 2. In particular, a suitable mask is not required to form the buried layer so that, on the one hand, the process is simplified and, on the other hand, the above-mentioned epitaxial shift (epi-shift) phenomenon no longer leads to misalignment between the buried layer and surface geometrical arrangements. Moreover, if antimony is used as the doping impurity for the formation of the buried layer 41 (the cathode), the phenomena of self-doping and enlargement of the layer during the various heat treatments of the process are prevented. This is due to the low mobility of antimony atoms. When the "trench" technique is used for the connection to the buried layer, the area required for the contact is smaller than that required for the contact with the "sinker" technique, that is, with diffused deep contact regions. This technique is therefore particularly advantageous when the dimensions of the active area of the detector are small.

The structure can be integrated with other components, for example, those of the circuit for processing the signal detected by forming the region for connection to the buried layer at a certain distance from the edge of the structure so as to leave a "dead region" which is insensitive to the particles but which can be used for this purpose.

That which is claimed is:

1. A particle detector including a semiconductor chip, said chip comprising:
   a first layer having a first type of conductivity and including an outer surface defining a first major surface of the chip;
   a second layer having the first type of conductivity and including an outer surface defining a second major surface of the chip opposite the first major surface;
   a third layer disposed between the first layer and the second layer having the first type of conductivity, and having a resistivity lower than a resistivity of each of the first and second layers and;
   a first region having a second type of conductivity and extending from the first major surface into the first layer;
   a second region having the second type of conductivity and extending from the second major surface into the second layer;
   first and third electrical connectors in contact with the first region and the third layer, respectively; and
   a second electrical connector in contact with the second region and comprising a plurality of elements of electrically-conductive material arranged at a predetermined distance apart on the second major surface.

2. A particle detector according to claim 1, wherein the first region forms a first junction with the first layer, and the second region forms a second junction with the second layer; and further comprising:
   a reverse biasing circuit connected to the first, second, and third electrical connectors, for reverse biasing the first and second junctions;
   a detecting circuit for detecting currents between the third and first electrical connectors, and for detecting currents between the third electrical connector and each of the plurality of elements of electrically-conductive material; and
   a processing circuit for processing the detected currents.

3. A particle detector according to claim 2, wherein the processing circuit comprises a comparator for sensing a difference between potentials of the plurality of elements of electrically-conductive material.

4. A particle detector according to claim 2, wherein the processing circuit comprises an electronic device for measuring and displaying processed detected currents.

5. A particle detector including a semiconductor chip, said chip comprising:
   a first layer having a first type of conductivity and including a surface defining a first major surface of the chip;
   a second layer having the first type of conductivity and including a surface defining a second major surface of the chip;
   a third layer disposed between the first and second layers having the first type of conductivity, and having a resistivity lower than a resistivity of each of the first and second layers and;
   a first region having a second type of conductivity and extending from the first major surface into the first layer;
   a second region having the second type of conductivity and extending from the second major surface into the second layer;
   a first conductive region in contact with the first region;
   a second conductive region in contact with the second region and comprising two elements of electrically-conductive material arranged at a predetermined distance apart on the second major surface; and
   a third conductive region in contact with the third layer.

6. A particle detector according to claim 5, wherein the first region forms a first junction with the first layer, and the second region forms a second junction with the second layer; and further comprising:
   a reverse biasing circuit connected to the first, second, and third electrical connectors, for reverse biasing the first and second junctions;
   a detecting circuit for detecting currents between the third and first electrical connectors, and for detecting currents between the third electrical connector and each of the two elements of electrically-conductive material; and a processing circuit for processing the detected currents.

7. A particle detector according to claim 6, wherein the processing circuit comprises a comparator for sensing a difference between potentials of the two elements of electrically-conductive material.

8. A particle detector according to claim 6, wherein the processing circuit comprises an electronic device for measuring and displaying processed detected currents.

9. A method of manufacturing a particle detector, comprising the following steps:

a) providing a semiconductor substrate having a first type of conductivity;

b) doping the substrate with impurities to form an intermediate layer having the first type of conductivity, having a resistivity lower than a resistivity of the substrate, and extending from a first major surface of the substrate;

c) growing, on the major surface of the substrate, an epitaxial layer of semiconductor material having the first type of conductivity and having a resistivity higher than the resistivity of the intermediate layer;

d) forming a first region having a second type of conductivity, extending into the epitaxial layer from an outer surface of the epitaxial layer;

e) forming a second region having the second type of conductivity, extending into the substrate from a second major surface of the substrate opposite the first major surface;

f) forming a first electrical connector for connection to the first region, in contact with the outer surface of the epitaxial layer;

g) forming a second electrical connector for connection to the second region, in contact with the second major surface of the substrate; and h) forming a third electrical connector extending from the outer surface of the epitaxial layer and contacting the intermediate layer.

10. A method according to claim 9, wherein step h) comprises:

forming, by doping and diffusion in the epitaxial layer, a deep contact region having the first type of conductivity, extending from the outer surface of the epitaxial layer to contact the intermediate layer, and defining an outline around a portion of the epitaxial layer having the first region; and forming a first electrode on an outer surface of the deep contact region.

11. A method according to claim 9, wherein step h) comprises:

forming, in the epitaxial layer, a trench extending from the outer surface into the epitaxial layer and as far as the intermediate layer, and which defines an outline around a portion of the epitaxial layer having the first region; and forming an electrically-conductive element in the trench extending from the intermediate layer to the outer surface of the epitaxial layer.

12. A method according to claim 9, wherein step g) comprises forming a plurality of electrically-conductive elements at a predetermined distance apart on an outer surface of the second region.

13. A method of making a particle detector, comprising:

a) providing a semiconductor substrate having a first type of conductivity;

b) doping the substrate to form an intermediate layer having the first type of conductivity, having a resistivity lower than a resistivity of the substrate, and extending from a first major surface of the substrate;

c) forming, on the major surface of the substrate, an epitaxial layer of semiconductor material having the first type of conductivity and having a resistivity higher than the resistivity of the intermediate layer;

d) forming a first region having a second type of conductivity, extending into the epitaxial layer from an outer surface of the epitaxial layer;

e) forming a second region having the second type of conductivity, extending into the substrate from a second major surface of the substrate opposite the first major surface;

f) forming a first electrical connector adjacent the outer surface of the epitaxial layer for connection to the first region;

g) forming a second electrical connector adjacent the second major surface of the substrate for connection to the second region; and h) forming a third electrical connector extending from the outer surface of the epitaxial layer and contacting the intermediate layer.

14. A method according to claim 13, wherein step h) comprises:

doping the epitaxial layer to form a deep contact region having the first type of conductivity, extending from the outer surface of the epitaxial layer to contact the intermediate layer, and defining a boundary around a portion of the epitaxial layer having the first region; and forming a first electrode on an outer surface of the deep contact region.

15. A method according to claim 13, wherein step h) comprises:

forming, in the epitaxial layer, a trench extending from the outer surface into the epitaxial layer and as far as the intermediate layer, and which defines an boundary around a portion of the epitaxial layer having the first region; and forming an electrically-conductive element in the trench extending from the intermediate layer to the outer surface of the epitaxial layer.

16. A method according to claim 13, wherein step g) comprises forming two electrically-conductive elements at a predetermined distance apart on an outer surface of the second region.

* * * * *